US007226853B2

(12) United States Patent
Bekiaris et al.

(10) Patent No.: US 7,226,853 B2
(45) Date of Patent: Jun. 5, 2007

(54) METHOD OF FORMING A DUAL DAMASCENE STRUCTURE UTILIZING A THREE LAYER HARD MASK STRUCTURE

(75) Inventors: Nikolaos Bekiaris, San Jose, CA (US); Timothy Weidman, Sunnyvale, CA (US); Michael D. Armacost, San Jose, CA (US); Mehul B. Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 598 days.

(21) Appl. No.: 10/197,936

(22) Filed: Jul. 16, 2002

(65) Prior Publication Data

US 2003/0119307 A1    Jun. 26, 2003

Related U.S. Application Data

(60) Provisional application No. 60/343,803, filed on Dec. 26, 2001.

(51) Int. Cl.
*H01L 21/4763* (2006.01)
(52) U.S. Cl. ............... 438/622; 438/637; 438/638
(58) Field of Classification Search ........ 438/622–623, 438/637–640, 700–701
See application file for complete search history.

(56) References Cited

U.S. PATENT DOCUMENTS

| 5,661,344 | A | 8/1997 | Havemann et al. |
| 5,886,410 | A | 3/1999 | Chiang et al. |
| 5,981,398 | A * | 11/1999 | Tsai et al. ............... 438/710 |
| 6,027,995 | A | 2/2000 | Chiang et al. |
| 6,054,379 | A | 4/2000 | Yau et al. |
| 6,071,809 | A | 6/2000 | Zhao |
| 6,127,263 | A | 10/2000 | Parikh |
| 6,168,726 | B1 | 1/2001 | Li et al. |
| 6,171,945 | B1 | 1/2001 | Mandal et al. |
| 6,174,451 | B1 | 1/2001 | Hung et al. |
| 6,204,168 | B1 | 3/2001 | Naik et al. |

(Continued)

FOREIGN PATENT DOCUMENTS

EP        1 154 468 A2    11/2001

OTHER PUBLICATIONS

Chu et al., "Direct Patterning of Low-K Material for Damascene Process," *Mat. Res. Soc. Symp. Proc.*, 476:51-57 (1997).

(Continued)

*Primary Examiner*—Thanh Nguyen
(74) *Attorney, Agent, or Firm*—Townsend & Townsend & Crew LLP

(57) ABSTRACT

A method of forming a dual damascene structure on a substrate having a dielectric layer already formed thereon. In one embodiment the method includes depositing a first hard mask layer over the dielectric layer; depositing a second hard mask layer on the first hard mask layer; depositing a third hard mask layer on the second hard mask layer and completing formation of the dual damascene structure by etching a metal wiring pattern and a via pattern in the dielectric layer and filling the etched metal wiring pattern and via pattern with a conductive material. In one particular embodiment the second hard mask layer is an amorphous carbon layer and the third hard mask layer is a silicon-containing material.

27 Claims, 7 Drawing Sheets

U.S. PATENT DOCUMENTS

| | | | |
|---|---|---|---|
| 6,214,637 B1* | 4/2001 | Kim et al. | 438/72 |
| 6,225,207 B1 | 5/2001 | Parikh | |
| 6,245,662 B1 | 6/2001 | Naik et al. | |
| 6,284,149 B1 | 9/2001 | Li et al. | |
| 6,287,990 B1 | 9/2001 | Cheung et al. | |
| 6,291,334 B1 | 9/2001 | Somekh | |
| 6,303,489 B1 | 10/2001 | Bass | |
| 6,303,523 B2 | 10/2001 | Cheung et al. | |
| 6,399,424 B1* | 6/2002 | Matsuura et al. | 438/125 |
| 6,472,315 B2 | 10/2002 | Nguyen et al. | |
| 6,514,852 B2 | 2/2003 | Usami | |
| 6,720,249 B1* | 4/2004 | Dalton et al. | 438/624 |
| 2001/0016405 A1 | 8/2001 | Nguyen et al. | |
| 2002/0155700 A1* | 10/2002 | Chen et al. | 438/639 |

OTHER PUBLICATIONS

Hasegawa et al., "Copper Dual Damascene Interconnects with Low-K ($K_{eff}$ <3.0) Dielectrics Using FLARE™ and an MSQ Hard Mask," sponsored by LSI Business & Technology Development Group, C.N.C. Sony Corporation.

Hayashi et al., "Process Dsign Methodology for Via-shape-controlled, Cu Dual-damascene Interconnects Tailored in Low-k Organic Film," *Technical Report of IBICE*, from Institute of Electronics (2001).

Hiroi et al., "Dual Hard Mask Process for low-k Porous Organosilica Dielectric in copper Dual Damascene Interconnect Fabrication," *IEEE*, (2001).

Kinoshita et al., "Process Design Methodology for Via-Shape-Controlled, Copper Dual-Damascene Interconnects in Low-k Organic Film," *IEEE*, 11.2.1-11.2.4 (2000).

Mosig et al., "Single and Dual Damascene Integration of a Spin-On Porous Ultra low-k Material," *IEEE*, (2001).

Suemasa et al., "Low-k Etch / Ash for copper Dual damascene," from *Challenges in Process Integration and Device Technology*, edited by Burnett et al., from *Proc. of SPIE*, 4182:281-286 (2000).

Yamamura et al., "Multilevel interconnects Technologies Using Cu and low-k Dielectrics," from The Institute of Electronics, Technical Report of IEICF, pp. 87-92 (2000).

Yamamura et al., "High Performance Copper Dual Damascene Interconnects Using an Organic Low-k Dielectrics," *Conf. Proc. ULSI XV*, presented by Materials Research Society, pp. 41-46 (2000).

R.D. Goldblatt et al., A High Performance 0.13 μm Copper BEOL Technology with Low-k Dielectric, *IEEE*, pp. 261-263 (Jun. 2000).

* cited by examiner

METHOD OF FORMING A DUAL DAMASCENE STRUCTURE UTILIZING A THREE LAYER HARD MASK STRUCTURE

CROSS-REFERENCES TO RELATED APPLICATIONS

This application claims the benefit of U.S. Provisional Application No. 60/343,803, filed Dec. 26, 2001, which is incorporated herein by reference.

BACKGROUND OF THE INVENTION

The present invention relates to the fabrication of integrated circuits. Some specific, embodiments of the invention pertain to a method for forming a dual damascene structure in an integrated circuit in which the etched dielectric layer(s) include one or more porous low dielectric constant films.

As semiconductor device sizes have become smaller and integration density increases, many issues have become of increasing concern to semiconductor manufacturers. One such issue is that of interlevel "crosstalk." Crosstalk is the undesired coupling of an electrical signal on one metal layer onto another metal layer, and arises when two or more layers of metal with intervening insulating or dielectric layers are formed on a substrate. Crosstalk can be reduced by moving the metal layers further apart, minimizing the areas of overlapping metal between metal layers, reducing the dielectric constant of the material between metal layers and combinations of these and other methods. Undesired coupling of electrical signals can also occur between adjacent conductive traces, or lines, within a conductive layer. As device geometries shrink, the conductive lines become closer together and it becomes more important to better isolate them from each other.

Another such issue is the "RC time constant" of a particular trace. Each conductive trace has a resistance, R, that is a product of its cross section and bulk resistivity, among other factors, and a capacitance, C, that is a product of the surface area of the trace and the dielectric constant of the material or the space surrounding the trace, among other factors. If a voltage is applied to one end of the conductive trace, charge does not immediately build up on the trace because of the RC time constant. Similarly, if a voltage is removed from a trace, the trace does not immediately drain to zero. Thus high RC time constants can slow down the operation of a circuit. Unfortunately, shrinking circuit geometries produce narrower traces, which results in higher resistivity. Therefore it is important to reduce the capacitance of the trace, such as by reducing the dielectric constant of the surrounding material between traces, to maintain or reduce the RC time constant.

Hence, in order to further reduce the size of devices on integrated circuits, it has become necessary to use insulators that have a lower dielectric constant than the insulators of previous generations of integrated circuits. To this end, semiconductor manufacturers, materials suppliers and research organizations among others have been researching and developing materials for use as premetal dielectric (PMD) layers and intermetal dielectric (IMD) layers in integrated circuits that have a dielectric constant (k) below that of silicon dioxide (generally between about 3.9–4.2) and below that of fluorine-doped silicate glass (FSG, generally between about 3.4–3.7). These efforts have resulted in the development of a variety of low dielectric constant films (low k films). As used herein, low k films are those having a dielectric constant less than about 3.0 including films having a dielectric constant below 2.0.

Some approaches to developing such low k films include introducing porosity into known dielectric materials to reduce the material's dielectric constant. Dielectric films when made porous, tend to have lower dielectric constants (the dielectric constant of air is normally 1.0). One particular class of porous low k films includes mesoporous silica materials. One known method of forming such mesoporous silica films is referred to as the sol gel process, in which high porosity films are produced by hydrolysis and polycondensation of a metal oxide.

The sol gel process is a versatile solution process for making ceramic material. In general, the sol gel process involves the transition of a system from a liquid "sol" (mostly colloidal) into a solid "gel" phase. The starting materials used in the preparation of the "sol" are usually inorganic metal salts or metal organic compounds such as metal alkoxides. The precursor solutions are typically deposited on a substrate by spin on methods. In a typical sol gel process, the precursor is subjected to a series of hydrolysis and polymerization reactions to form a colloidal suspension, or a "sol." Further processing of the "sol" enables one to make ceramic materials in different forms. One method of forming such mesoporous low k films is described in U.S. application Ser. No. 09/823,932, filed on Mar. 29, 2001 in the name of Robert P. Mandel et al. and assigned to Applied Materials, Inc., the assignee of the present case. The Ser. No. 09/823,932 application is hereby incorporated by reference in its entirety.

Concurrent with the move to intermetal dielectric layers having a dielectric constant lower than silicon oxide, many semiconductor manufacturers are using copper rather than aluminum in the formation of their multilevel interconnect structures. Because copper is difficult to etch in a precise pattern, however, the traditional deposition/selective etch process used for forming such interconnects has become disfavored. Accordingly, a process referred to as a dual damascene process, is used by most semiconductor manufacturers to form copper interconnects. In a dual damascene process, a blanket intermetal dielectric layer is deposited and then subsequently patterned and etched to define both the interlayer vias and the interconnect lines. Copper or another conductive material is then inlaid into the defined pattern and any excess conductive material is removed from the top of the structure in a planarization process, such as a chemical mechanical polishing (CMP) process.

The etching of the dielectric layer in such a dual damascene process typically includes two separate lithography steps. One step defines the trenches and another the vias. Photoresist and organic bottom antireflective coating (BARC) films have been found to penetrate the pores of porous low k films so dual damascene lithography techniques for porous low k films typically include the use of a hard mask between the ELK material and the photoresist. One such scheme that has been proposed includes the use of two separate hard masks as shown in FIGS. 1a through 1h.

FIGS. 1a through 1h illustrate one method used in the fabrication of a trench-first dual damascene scheme using a dielectric layer 10 formed over a substrate 2. Substrate 2 may include an already formed conductive line 4, e.g., a copper line, a surrounding dielectric material 6 and a barrier layer separating the two. Dielectric layer 10 may be a single layer or a multilayer dielectric stack. Dielectric layer 10 shown in FIG. 1a includes multiple layers: a barrier layer 12, a via dielectric layer 14 and a porous low k layer 16. Formed over dielectric layer 10 are a first hard mask layer 20, a second hard mask layer 22, a bottom antireflective coating 24 and a photoresist layer 30.

As shown in FIG. 1a photoresist layer 30 is patterned and etched using a metal wiring pattern to form an opening 32. The metal wiring pattern is then transferred into hard mask layer 22 using an appropriate etching process (FIG. 1b). Any remaining photoresist layer 30 is then stripped along with antireflective coating 24 (FIG. 1c). Next, a new bottom antireflective coating 40 and photoresist layer 42 is formed over the substrate such that antireflective coating 40 fills in etched opening 32 (FIG. 1d).

As shown in FIG. 1d, photoresist layer 42 is then patterned and etched according to a via pattern to form an opening 34. The via pattern is then transferred into dielectric stack 10 using photoresist layer 42 as the pattern (FIG. 1e) and afterwards, photoresist layer 42 and antireflective layer 40 are stripped leaving a partially formed via 50 and a larger opening 32 (FIG. 1f). Next, the desired trench 52 and via 50 are etched into low k dielectric layer 10 (FIG. 1g) and barrier layer 12 is etched through to complete the etched via formation (FIG. 1h). Once the formation of via hole 50 and trench 52 are completed, the structure can be filled with copper or another conductive material. The filled structure is then subjected to a planarization step, such as a CMP step, to complete the formation of the interconnect structure. In the completed structure the top of the just-formed conductive line is essentially even with the top of dielectric layer 10.

While the above described process can be used to successfully form dual damascene structures for some integrated circuits, it not without its limitations. For example, hard mask layer 22 described in the above process is typically required to have a thickness in the range of 1500 Å to 5000 Å in order to remain in place during the etching steps shown in FIGS. 1f, 1g and 1h. Such a relatively thick layer is required for the scheme because etch chemistry selectivity issues and physical sputtering. If the layer is too thin, it will be etched entirely away during the etching steps shown in FIGS. 1f–1h, which in turn may cause the complete loss of hard mask layer 20 during the subsequent CMP process. The loss of hard mask layer 20 during CMP may in turn cause the CMP slurry to intrude into the porous low k dielectric material causing material and defect issues. Similarly, hard mask layer 22 is subject to sputtering effects during the etching processes shown in FIGS. 1f–1h. If the layer is too thin, such sputtering may result in the corner chopping and critical dimension loss in the underlying etched features (via 50 and trench 52). This in turn may result in shorting of conductive lines and/or other problems.

The requirement of such a relatively thick hard mask layer 22 however leads to lithography issues. For example, via opening 34 is patterned inside, or at least partially inside, previously etched and subsequently filled opening 32. The topography created by this hard mask trench etch/fill process may present depth of focus issues during the subsequent lithography process of photoresist layer 42. This is especially true as such dual damascene schemes for low k films are expected to be used in processes that include minimum feature sizes of 0.15 microns and smaller thereby using radiation wavelengths of 193 nm or less for the lithography steps.

FIG. 2, is a simplified cross-sectional drawing of a substrate showing the possible topography of antireflective layer 40 and photoresist layer 42 just prior to the etching of opening 34 shown in FIG. 1d. Photoresist layer 42 includes areas 60 that are to be developed by exposing the corresponding portions of the photoresist layer to appropriate radiation. As shown in FIG. 2, antireflective coating 40 is generally not planar having a recessed portion 62 in an area corresponding to particularly large opening 32 of hard mask layer 22 and raised portions 64 corresponding to areas of the substrate having small trenches or no trenches at all. The uneven topography of layer 40 results in a similarly uneven topography for photoresist layer 42 and a height difference 70 between the top surface of layer 42 in areas 64 as compared to the top of layer 42 in area 62.

The size of height difference 70 is in part due to the thickness of hard mask layer 22. A thinner hard mask layer 22 enables the formation of more planar layers 40 and 42. When height difference 70 is greater than or close to the depth of focus (DOF) of the radiation used to pattern layer 42, portions of layer 42 may not be properly exposed during the patterning process. This, in turn, may result in underdeveloped photoresist and incorrectly dimensioned vias and/or vias that are not opened uniformly all across the wafer.

Accordingly, it can be seen that improvements and/or alternative schemes for forming dual damascene structures using porous low dielectric constant films are desirable.

BRIEF SUMMARY OF THE INVENTION

Embodiments of the present invention pertain to a method for forming a dual damascene structure in an integrated circuit. Some embodiments of the invention minimize the thickness of the hard mask structure used to pattern a dual damascene structure by employing a three layer hard mask structure.

One embodiment of the of the method of the invention forms a dual damascene structure on a substrate having a dielectric layer formed thereon by depositing a first hard mask layer over the dielectric layer; depositing a second hard mask layer on the first hard mask layer; depositing a third hard mask layer on the second hard mask layer and completing formation of the dual damascene structure by etching a metal wiring pattern and a via pattern in the dielectric layer and filling the etched metal wiring pattern and via pattern with a conductive material.

In some embodiments the second hard mask layer is an amorphous carbon layer and the third hard mask layer is a silicon-containing material. In one particular embodiment where the dielectric layer is a porous low k silica film, the amorphous carbon layer has a carbon content of between 40–90 percent, a hydrogen content between 10–50 percent and a nitrogen content of between 0–10 percent. The relatively high carbon content enables the layer to have a high etch selectivity with respect to the porous silica low k layer thereby enabling the layer to be relatively thin. In other embodiments the third hard mask is a silicon oxide, silicon nitride or silicon oxynitride film. The third hard mask is used to protect the second hard mask during the stripping of an overlying photoresist layer and/or organic antireflective coating. Silicon oxide, silicon nitride and silicon oxynitride all exhibit a high etch selectivity to standard oxygen-plasma photoresist stripping processes thus enabling the third hard mask layer to be even thinner than the second hard mask layer. In one embodiment, the combined thickness of the second and third hard mask layers is no more than 1000 Å with the third hard mask layer having a thickness of 400 Å or less.

In some embodiment the second hard mask layer exhibits a high etch selectivity with respect to the dielectric layer. In still other embodiments the step of completing the dual damascene process includes, after depositing the conductive material, polishing the conductive material using a chemical mechanical polishing step where the first hard mask layer is resistant to the chemical mechanical polishing step.

According to another embodiment of the method of the invention, a dual damascene structure is formed over a substrate having a first layer interconnect layer already formed thereon, where the first interconnect layer includes a dielectric material formed between a plurality of conductive lines. The method of the embodiment forms a multilayer dielectric stack over the first interconnect layer including a barrier dielectric layer, a via dielectric layer and a porous low dielectric constant layer. A first hard mask is then formed over the porous low dielectric constant layer, a second hard mask is formed over the first hard mask and a third hard mask is formed over the second hard mask. Next, an antireflective coating is formed over the third hard mask and a photoresist layer is formed over the antireflective coating. The photoresist layer is then patterned in accordance with a metal wiring pattern to expose selected portions of the antireflective coating, and the antireflective coating and third hard mask layer are etched layer to transfer the metal wiring pattern from the photoresist layer into those layers. The photoresist layer and antireflective coating are stripped and the second hard mask layer is etched to transfer the metal wiring pattern to the second hard mask layer. Next, a second antireflective coating is deposited over the patterned second hard mask layer and a second photoresist layer is formed over the second bottom antireflective coating. The second photoresist layer is then patterned in accordance with a via pattern to expose selected portions of the second antireflective coating and a via hole is etched through the second antireflective coating, the third, second and first hard mask layers and into the porous low dielectric constant layer. The second photoresist layer and second bottom antireflective coating are removed, and the metal wiring pattern is etched into the porous low dielectric constant layer while the via pattern is etched further into the dielectric stack. Next the barrier layer is etched through in the via to expose portions of the conductive layer and the second hard mask is removed. Finally, the etched via and metal wiring pattern are filled with a conductive material and planarized.

These and other embodiments of the present invention, as well its advantages and features, are described in more detail in conjunction with the description below and attached figures.

DETAILED DESCRIPTION OF THE INVENTION

As mentioned above, embodiments of the present invention pertain to a method for forming a dual damascene structure in an integrated circuit. Embodiments of the invention are particularly useful for integrated circuits in which one or more of the dielectric layers used in the dual damascene structure is a porous low dielectric constant material, such as an mesoporous silica material. Other embodiments of the invention, however, can be used with other porous low k materials, such as aerogels, xerogels, zeolites as well as with other nonporous dielectric materials, such as nonporous silicon oxide materials, carbon-doped silicon oxide and others.

Some embodiments of the invention pertain to forming a dual damascene structure using a trench-first etching scheme and a hard mask stack of three distinct hard mask layers. The hard mask stack is formed over the dielectric material being etched. As will be appreciated by a person of skill in the art, one aspect of the invention lies in the relationship between the materials used in the hard mask layers and the various etch chemistries used to selectively etch desired patterns in the layers and in the underlying dielectric material.

In one embodiment, the three-layer hard mask stack includes a top silicon-containing layer, a middle carbon-containing organic layer and a bottom silicon-containing layer. The top hard mask layer protects the middle carbon-containing organic layer during the stripping of an overlying photoresist layer and/or organic antireflective coating. The middle hard mask layer protects the bottom silicon-containing layer during one or more intermediate etch steps that etch a metal wiring pattern and via pattern into one or more of the dielectric layer(s) that make up the final dual damascene structure, and the bottom hard mask layer protects the underlying dielectric material, e.g., the porous low k material, during a subsequent CMP processing step in which the metal or other type of conductor that is used to fill the damascene structure is planarized.

In some embodiments, the physical properties of the top two hard mask layers, combined with the various etch and stripping processes the layers are exposed to, enable the overall thickness of the top two hard mask layers to be no more than 1000 Å for dual damascene processes having minimum feature sizes of 0.15 micron and less. Such relatively thin layers allow for the via photoresist layer to be patterned uniformly across the entire substrate.

Figure 1A:
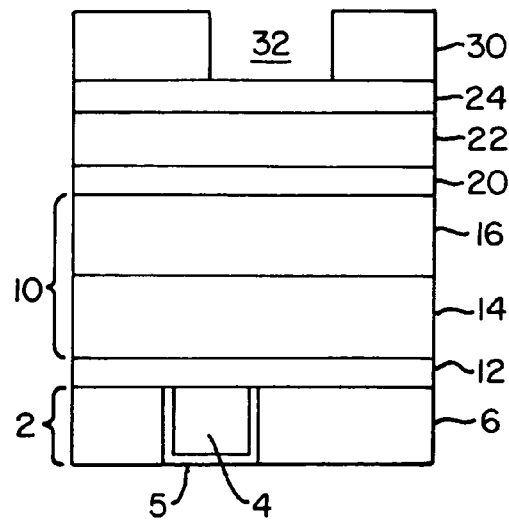
FIGS. 1a–1h are simplified cross-sectional views of a portion of a substrate upon which a dual damascene interconnect structure is being fabricated.
Figure 1B:
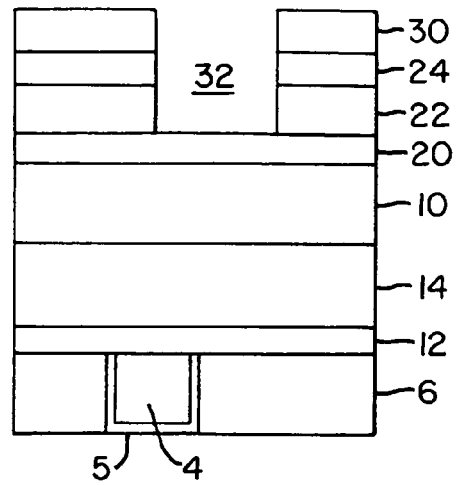
Figure 1C:
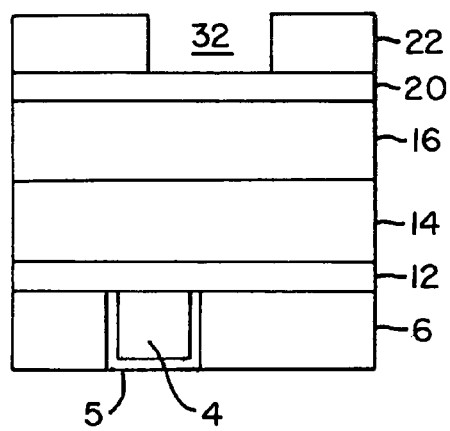
Figure 1D:
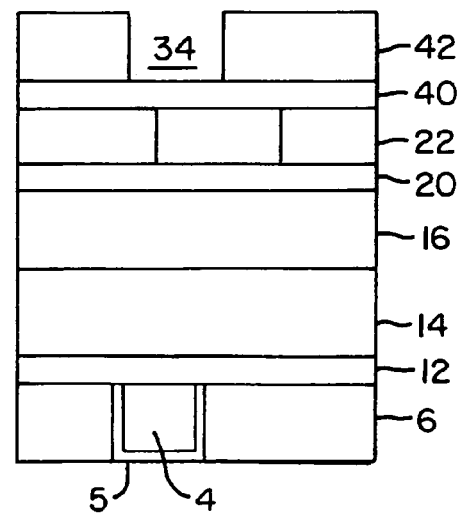
Figure 1E:
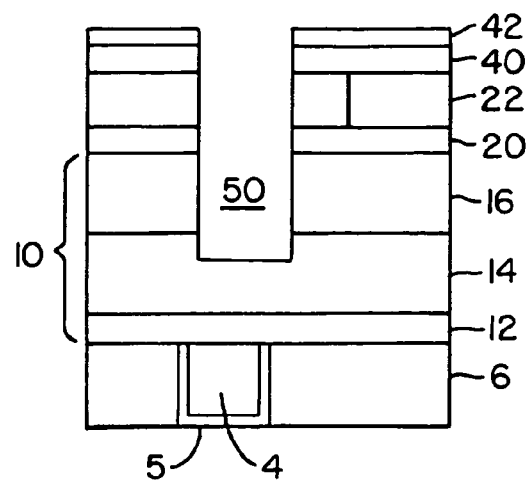
Figure 1F:
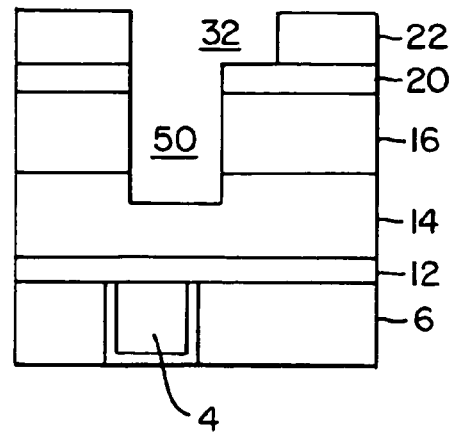
Figure 1G:
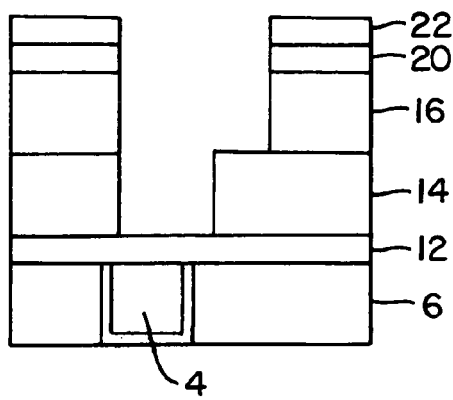
Figure 1H:
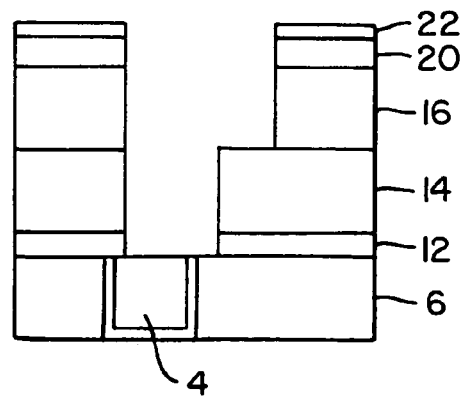
Figure 2:
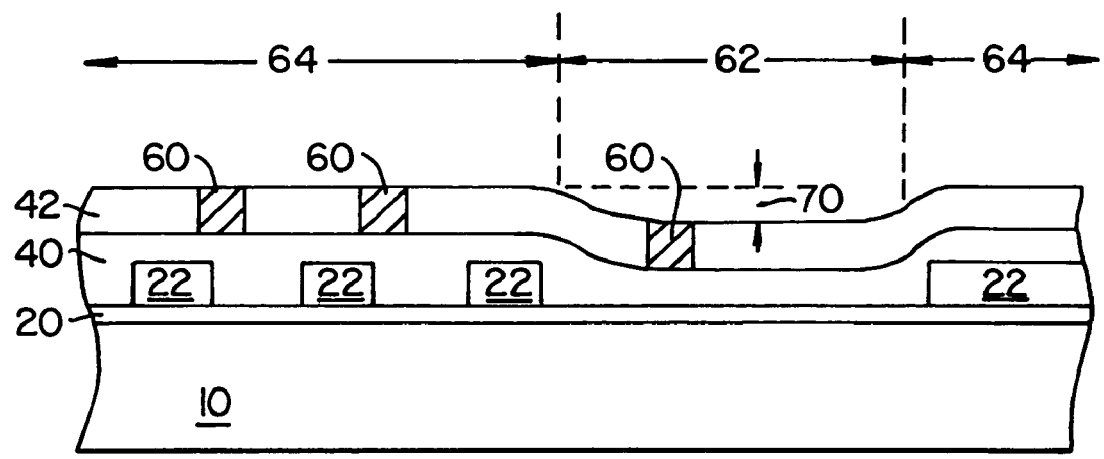
FIG. 2 is a simplified cross-sectional view of an expanded portion of the substrate shown in FIG. 1d prior to the patterning of the photoresist layer shown therein.
Figure 3:
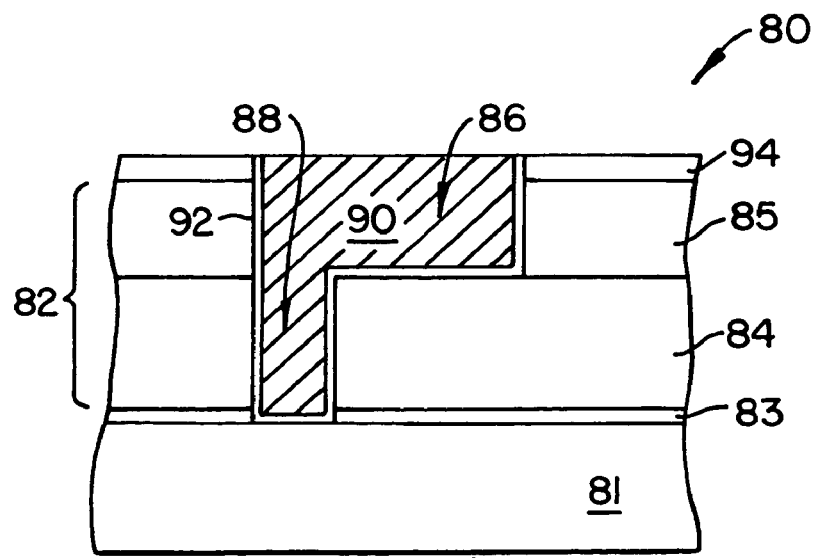
FIG. 3 is an example of a dual damascene structure fabricated according to one embodiment of the present invention.

One example of a dual damascene structure 80 fabricated according to an embodiment of the invention is shown in FIG. 3. Structure 80 includes a dielectric layer 82 deposited over a substrate 81. In this embodiment, dielectric layer 82 is a multilayer dielectric that includes a barrier layer 83, a via dielectric layer 84 and a trench dielectric layer 85. In other embodiments, dielectric layer 82 may include more or fewer layers as would be understood by a person of skill in the art. A trench 86 and a via or contact opening 88 are formed within dielectric layer 82. Trench 86 and via/contact opening 88 are both filled with a conductive material 90, such as copper, and lined with an appropriate barrier material 92, such as tantalum nitride when the filled conductive material is copper. Also shown in FIG. 3 are portions of a hard mask layer 94 that remain after the completion of the dual damascene structure. The portions of layer 94 shown in FIG. 3 protected trench dielectric layer 85 from a CMP or similar polishing step used to remove excess conductive material 90 from the structure.

Figure 4:
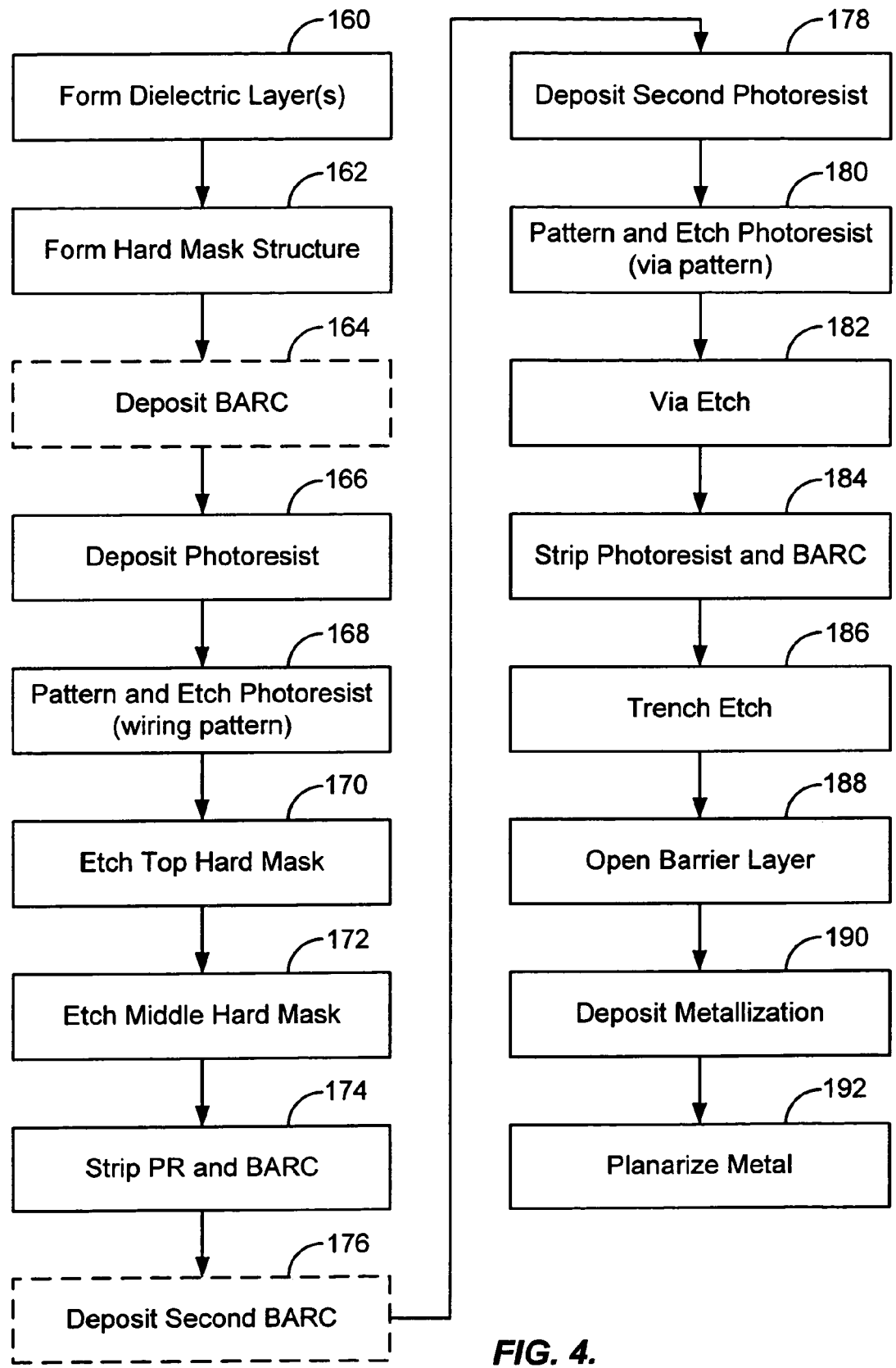
FIG. 4 is a flow chart depicting an exemplary trench-first dual damascene process according to one embodiment of the present invention.

In order to better understand how dual damascene structure 80 is formed according to embodiments of the invention, reference is made below to FIG. 4, which is a flowchart depicting an exemplary dual damascene process according to one embodiment of the invention, and FIGS. 5a through 5l, which sequentially depict the various steps discussed with respect to FIG. 4 as they pertain to a substrate 100. It is to be understood that the illustrated process is for exemplary purposes only. Other embodiments of the invention may include fewer or additional steps. Also, the illustrated process is typically performed in the context of a larger processing scheme used to form one or more integrated circuits over substrate 100.

Substrate 100 may be any suitable substrate material upon which semiconductor devices are formed, such as a silicon substrate, a germanium substrate, a silicon-germanium substrate and the like. Substrate 100 may also include a plurality of already formed layers over the base substrate material. In the example shown in FIGS. 5a to 5l, substrate 100 includes an already formed conductive line 104, a surrounding dielectric material 102 and an appropriate conductive barrier layer 105 separating the two. Conductive line 104 may be, for example, a copper line, an aluminum line or another appropriate conductive material. Dielectric material 102 may be a low k dielectric material as discussed above and barrier layer 105 may include one or more barrier and seed layers as appropriate based on the material used for conductive line 104 and dielectric material 102. In one embodiment where line 104 is an electroplated copper line and dielectric material 102 is a mesoporous silica film, barrier layer 105 includes a tantalum nitride layer barrier layer and a chemical vapor deposition (CVD) or physical vapor deposition (PVD) copper seed layer.

Figure 5A:
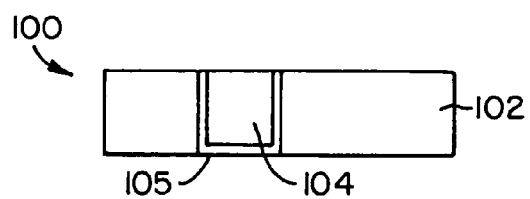
FIGS. 5a–5l are simplified cross-sectional views of a substrate being processed according to the sequence of steps set forth in FIG. 4.
Figure 5B:
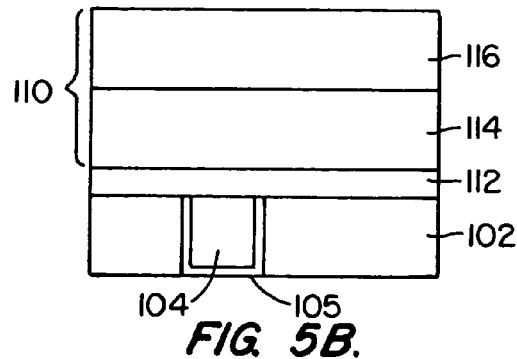

A dual damascene process according to this embodiment of the invention begins with the formation of a dielectric layer 110 over copper line 104 and dielectric layer 102 (step 160). Dielectric layer 110 may be a multilayer dielectric stack as discussed above with respect to FIG. 3. For example as shown in FIG. 5b, dielectric layer 110 may include a barrier dielectric layer 112, a via dielectric layer 114 and a porous low k layer 116. In one embodiment, barrier layer 112 is a silicon nitride or silicon carbide layer, such as a BloK™ film (barrier low k dielectric) developed by Applied Materials; via dielectric layer 114 is a carbon-doped silica layer, such as a black diamond film developed by Applied Materials and trench dielectric layer 116 is a mesoporous silica film. It is to be understood, however, that a variety of different materials can be used to form dielectric layer 110. In other embodiments, layer 110 is a single layer of dielectric material. In still other embodiments, the etch stop layer may be a silicon nitride layer and the via dielectric layer may include an etch stop layer between it and the trench dielectric layer, such as a BloK™ layer or similar film.

Figure 5C:
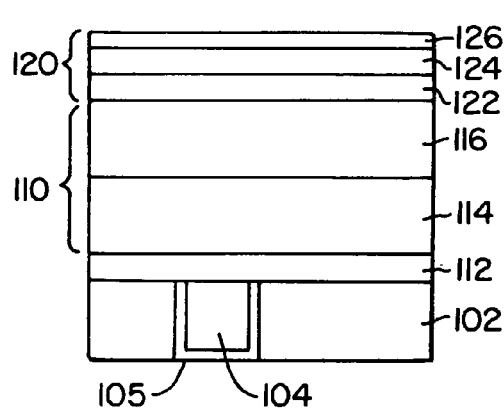

Referring to FIG. 5c, a three layer hard mask structure 120 is formed over dielectric layer 110 (step 162). Hard mask structure 120 includes a first hard mask layer 122, a second hard mask layer 124 and a third hard mask layer 126. As already discussed, one important aspect of the present invention is the different physical properties that each of layers 122, 124 and 126 exhibit and the relationship between these properties and the etch chemistries used to subsequently pattern the layers and the underlying dielectric layer 110. In one embodiment, layer 122 is generally a nonporous, silicon-containing film. In some embodiments layer 122 is a BloK™ film. Such a film has a dielectric constant in the range of 4.0–5.0. It is generally desirable that the dielectric constant of layer 122 be relatively low since portions of layer 122 remain in the damascene structure after its completion (see FIG. 3, layer 86). Thus, in other embodiments layer 122 is a carbon-doped silica layer, such as a Black Diamond™ film, that has a dielectric constant of less than 3.0.

Additionally, in embodiments where layer 122 is deposited directly over a mesoporous silica or similar film, it is preferable that the process used to deposit layer 122 not include an oxygen-based plasma because excited oxygen species in the plasma may damage the mesoporous silica layer. In one embodiment, layer 122 is a carbon-doped silica layer deposited from a non-oxidizing plasma that includes tetramethylcyclotetrasiloxane (TMCTS) as a silica source. Also, layer 122 acts as a capping layer that protects dielectric layer 110 from the slurry used in the CMP step used to planarize copper deposited within the damascene structure (see FIG. 3, layer 94). Thus, layer 122 should have a low CMP polish rate compared to copper or any other conductive material used to complete the damascene structure.

Figure 5D:
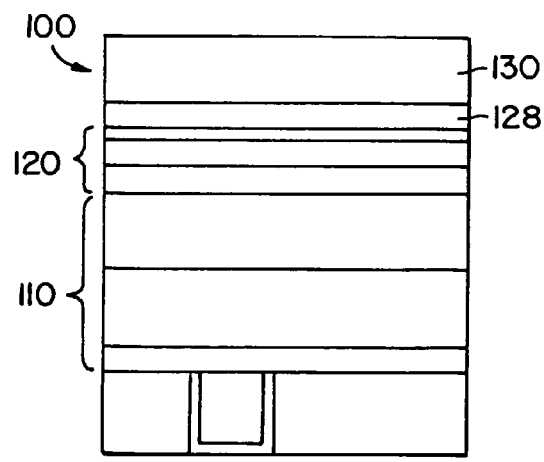
Figure 5E:
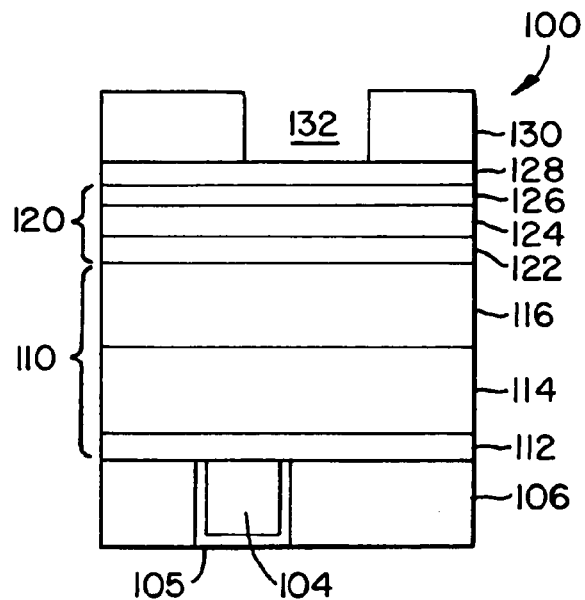
Figure 5F:
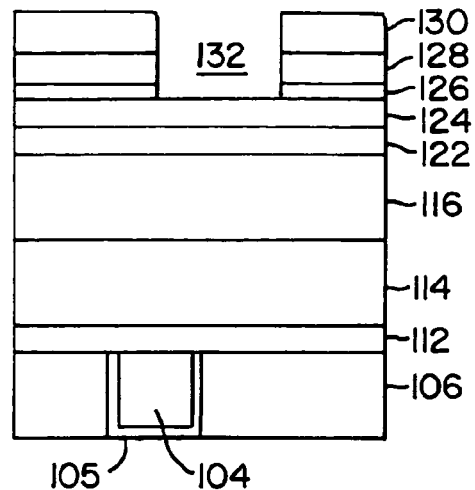
Figure 5G:
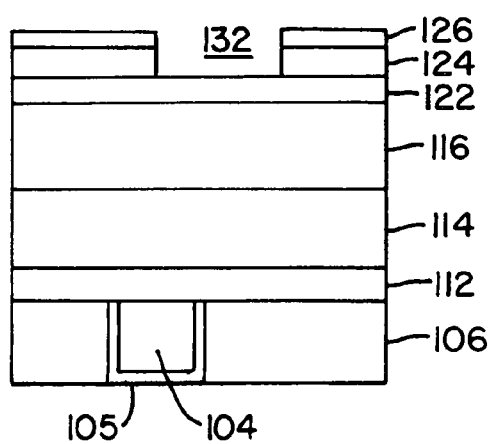
Figure 5H:
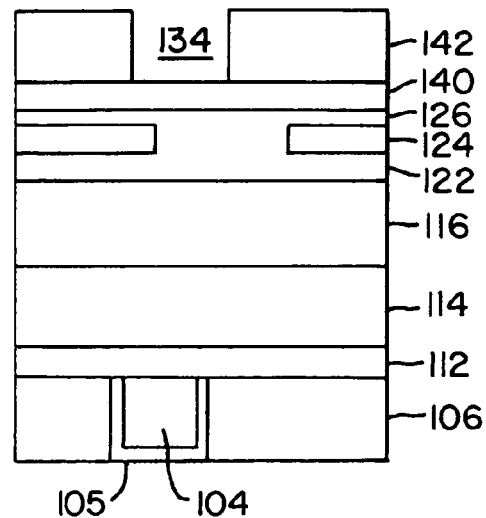
Figure 5I:
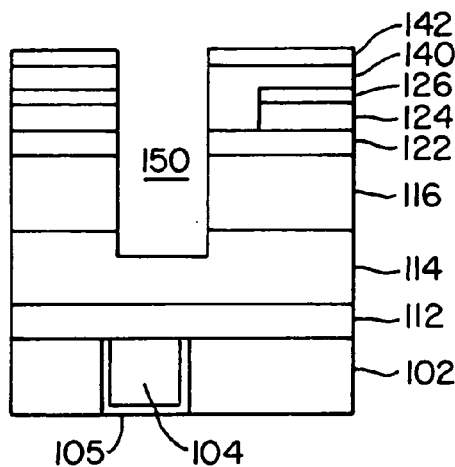
Figure 5J:
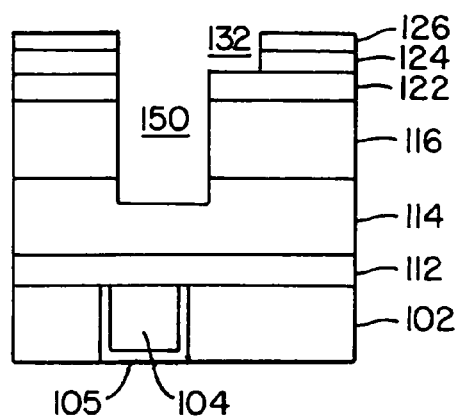
Figure 5K:
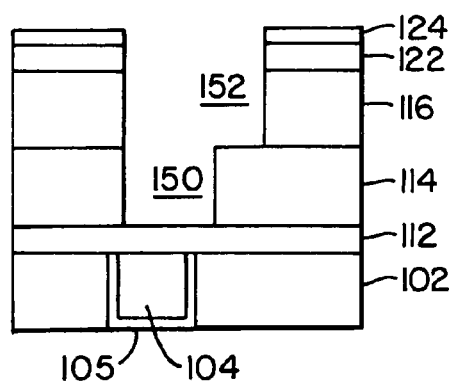

Layer 124 is used to pattern hard mask layer 122 and at least a portion of dielectric layer 110 during the trench and via etch step (FIG. 5k). Thus, layer 124 needs to exhibit good etch selectivity to both layer 122 and the underlying dielectric layer. In embodiments where the layer 122 and the underlying dielectric layer are silicon-containing materials having a large number of Si—O bonds, such as various silicon oxide films, layer 124 should contain very few, to preferably no, Si—O bonds. In one embodiment, layer 124 is an organic amorphous carbon film having a carbon content of between 40–90 atomic percent, a hydrogen content of between 10–50 atomic percent and a nitrogen content of between 0–10 atomic percent. Such a film may be deposited, for example, by a CVD process in which the process gas is a hydrocarbon compound having a general formula $C_xH_y$, where x is an integer between 2 and 4 inclusive and y is an integer between 2 and 10 inclusive, an inert gas such as argon or helium. Other gases such as hydrogen ($H_2$), nitrogen ($N_2$) and/or ammonia ($NH_3$) can be added to the deposition gas to control the hydrogen ratio or introduce nitrogen or another element into the film. Examples of suitable hydrocarbon sources include propylene ($C_3H_6$), propyne ($C_3H_4$), propane ($C_3H_8$), butane ($C_4H_{10}$), butylene ($C_4H_8$), butadiene ($C_4H_6$) or acetylene ($C_2H_2$) as well as combinations thereof. Specific examples of suitable amorphous carbon deposition processes are set forth in U.S. application Ser. No. 09/590,322, filed on Jun. 8, 2000, in the name of Kevin Fairbairn et al. and assigned to Applied Materials, Inc., the assignee of the present case. The Ser. No. 09/590,322 application is hereby incorporated by reference in its entirety.

Hard mask layer 126 is a silicon-containing film that protects layer 124 during the removal of photoresist layer 142 and BARC layer 140 (shown in FIGS. 5h and 5i). Layers 140 and 142 are typically removed using an oxygen stripping process as is known to those of skill in the art. In one embodiment layer 126 is a thin dielectric antireflective coating such as a silicon oxynitride ($SiO_xN_y$) or silicon nitride ($Si_xN_y$) film.

Referring to FIG. 5d, after the formation of mask structure 120, an optional bottom antireflective coating 128 is formed (step 164). In one embodiment bottom antireflective coating 128 is an organic material that is deposited using spin-on techniques known to those of skill in the art. Next, a photoresist layer 130 is formed over layer 128 (step 166).

Referring to FIG. 5e, photoresist layer 130 and antireflective coating 128 are then patterned and etched using a metal wiring pattern to form an opening 132 using techniques that are well known to those of skill in the art (step 168). In some embodiments, layers 130 and 128 are etched in a single step, while in other embodiments they are etched separately. As shown in FIG. 5f, the metal wiring pattern is then transferred into hard mask layer 126 using an appropriate anisotropic etching process (step 170). One example of an etching process that can be used in step 170 forms a plasma from $CF_4$ or $CF_4/CHF_3$ gases.

The metal wiring pattern is transferred into hard mask layer 124 as shown in FIG. 5g (step 172) with an anisotropic etch process. If any photoresist and or BARC remains after step 172, the remaining photoresist and/or BARC is stripped using a suitable anisotropic strip process (step 174), for example, a low pressure $NH_3$ plasma. The etch process of step 172 and the strip process of step 174 should be highly selective between layer 126 and layer 124. It is important to not completely remove layer 126 at this stage as it protects layer 124 thereby preventing critical dimension loss during the stripping of a subsequently deposited photoresist layer as described in more detail with respect to FIG. 5j. In one embodiment, the etching process used to transfer the metal wiring pattern into layer 124 (step 172) is an $O_2$, an $O_2$ and $N_2$ or an $NH_3$ anisotropic plasma etch process.

Referring to FIG. 5h, next a new organic bottom antireflective coating 140 and photoresist layer 142 are formed over the substrate such that antireflective coating 140 fills in etched opening 132 (steps 176 and 178).

Photoresist layer 142 is then patterned and etched according to a via pattern to form an opening 134 (step 180) using a technique similar to the one used to pattern and etch photoresist layer 130. Embodiments of the invention make the lithography process of step 180 more robust than the process described with respect to FIGS. 1a–1h because the combined step height of layers 124 and 126 can be less than the height of layer 22 to etch the same depth trenches in the underlying silicon-containing dielectric layer.

The via pattern is then transferred into dielectric stack 110 using photoresist layer 142 as the etching mask to form a partially formed via 150 as shown in FIG. 5i (step 182). Etch selectivity between photoresist layer 142 and the underlying materials etched during step 182 should be maximized in order to allow via 150 to be etched fairly deeply into dielectric stack 110. In some embodiments the depth of via etch step 182 is set based on the time that is required to etch trench 152 to its required depth in step 186 (shown in FIG. 5l). Basically, etch step 186 should etch trench 152 to its desired depth and clear all the remaining via dielectric layer 114 in via 150 stopping on the via etch stop, dielectric barrier layer 112. One difference between some embodiments of the present invention and the prior art dual hard mask scheme described with respect to FIGS. 1a–1h is that if vias are partially misaligned, etching step 182 must etch through the amorphous carbon hard mask layer 124 thereby increasing the difficulty of this etching step. One etching process that can be satisfactorily used in step 182 is a multistep etch process that includes a BARC open etch, a first hard mask (layer 122) open etch step and then first and second main etch steps tailored to etch layers 116 and 114, respectively. In one embodiment, the BARC open etch step can be a $CF_4$-based plasma.

Referring to FIG. 5j, afterwards photoresist layer 142 and antireflective layer 140 are stripped thereby reopening opening 132 (step 184). In embodiments of the invention the stripping process of step 184 is a directional, anisotropic process to prevent lateral removal of portions of the amorphous carbon hard mask layer 124. Additionally, the stripping process should not damage any exposed portions of dielectric stack 110 including porous low k layer 116 and should not remove hard mask layer 122 as that is needed to protect porous low k a layer 116 during step 192. In one embodiment, stripping step 184 is performed by an anisotropic strip (e.g., an $NH_3$ strip) or an anisotropic $H_2$ plasma etch. In one particular embodiment the $NH_3$ strip step is carried out in a eMAX chamber, outfitted for 200 mm wafers, manufactured by Applied Materials using a $NH_3$ flow rate of 200 sccm, a pressure of 80 mTorr and an RF power level of 350 Watts.

The desired trench 152 and via 150 are then etched into low k dielectric layer 110 as shown in FIG. 5k stopping on dielectric layer 112 (step 186) using, for example a $Ar/C_4F_8/CH_2F_2$ or $CF_4/N_2$ etch process. The etch process should be selective for trench 152 versus via 150 in order to stop at the bottom of the trench. Because hard mask 124 is more different in composition to the layers in dielectric stack 110 than is hard mask 22 used to mask the substrate during a corresponding step the prior art process of FIGS. 1a–1h, etch step 186 can be designed to have a greater etch selectivity between layer 124 and stack 110 than if a layer having the characteristics of hard mask 22 was employed. In some embodiments the etch selectivity between layer 124 and dielectric stack 110 is at least 6:1. As can be appreciated by a person of skill in the art, having such a relatively high etch selectivity at this step allows layer 124 to be considerably thinner than layer 22 in the prior art process. In some embodiments layer 124 is less than 900 Å thick for dual damascene processes having minimum feature sizes of 0.15 micron and less.

Figure 5L:
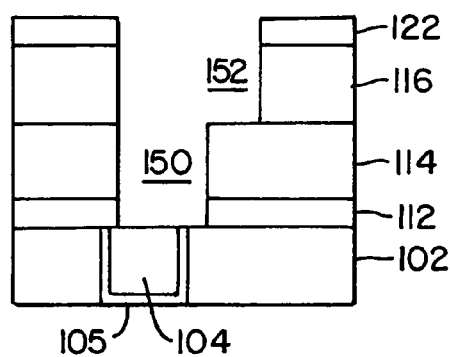

Next, dielectric barrier layer 112 is etched through to complete the etched via formation as shown in FIG. 5l (step 188). Layer 124 protects underlying layers 122, 116 and 114 during the opening of layer 112. In one embodiment, the barrier layer punch through etch step is a $Ar/CHF_3/O_2/CF_4$ plasma etching process.

Once the formation of via hole 150 and trench 152 are completed, the structure can be lined with a barrier metal such as tantalum nitride and filled with copper or another conductive material (step 190, not shown in any FIGS. 5a–5l). The filled structure is then subjected to a planarization step, such as a CMP step, (step 192) to complete the formation of the interconnect structure and form a structure such as that shown in FIG. 3.

Because hard mask layer 124 is a non-silicon containing material with completely different etching characteristics than dielectric stack 110, layer 124 can be considerably thinner than a silicon-containing hard mask layer that may otherwise be used. Using a non-silicon material, such as amorphous carbon, as layer 124, however, requires the use of third hard mask layer 126 to protect layer 124 during removal of overlying photoresist layer 142 and organic antireflective coating 140. Amorphous carbon films have material properties very similar to organic photoresist and antireflective coatings and would thus exhibit a very low etch selectivity to the photoresist/antireflective coating stripping process. Silicon-containing materials such as silicon oxide, silicon nitride and silicon oxynitride, however, exhibit a very high etch selectivity to such stripping processes allowing hard mask layer 126 to be very thin. These attributes of layers 124 and 126 allow the combined thickness of the layers to be considerably thinner than the thickness of hard mask layer 22 described with respect to, one known prior art process in FIGS. 1a–1h as described in more detail below.

In a specific embodiment for dual damascene processes having minimum feature sizes of 0.15 micron and less, layer 126 is between 100–400 Å thick, layer 124 is between 400 and 900 Å thick and the combined thickness of layers 124 and 126 is no more than 1000 Å.

In some embodiments layers 122, 124 and 126 are all deposited using chemical vapor deposition methods. Such embodiments allow for the deposition of the entire three layer (layer 122, 124, 126) hard mask stack to be deposited either in a single chamber in an in situ process or in a separate dedicated chambers of a single multichamber cluster tool.

In one specific embodiment where layer 122 is a Black Diamond™ or carbon-doped oxide film, layer 124 is an amorphous carbon film and layer 126 is a silicon oxynitride film, each layer 122, 124 and 126 is deposited in separate, dedicated chamber situated around a Centura™ or Producer™ mainframe cluster tool manufactured by Applied Materials. In this embodiment, layers 122, 124 and 126 are deposited using the processes set forth below in Table 1.

TABLE 1

Exemplary Deposition Processes For Layers 122, 124 and 126

| Parameter | Layer 122<br>TMLTS: 1000 mgm<br>He: 400 sccm | Layer 124<br>$C_3H_6$: 300 sccm | Layer 126<br>$SiH_4$: 50 sccm<br>$N_2O$: 150 sccm<br>He: 2000 sccm |
|---|---|---|---|
| Process Gas | | | |
| Temp | 350° C. | 400° C. | 400° C. |
| Pressure | 4 Torr | 6.5 Torr | 6.5 Torr |
| Spacing | 300 mils | 220 mils | 375 mils |
| RF Power | 335 Watts | 700 Watts | 120 Watts |

The description above is intended to help illustrate the principles of this invention and is not intended to limit the scope of this invention in any way. Also, while the invention has been described with reference to specific examples thereof, it will be apparent to a person of ordinary skill in the art that various changes and modifications can be made to the concepts presented herein without departing from the spirit and scope of the invention. These equivalents and alternatives are intended to be included within the scope of the present invention.

What is claimed is:

1. A method of forming a dual damascene structure on a substrate having a dielectric layer already formed thereon, said method comprising:
   depositing a first hard mask layer over the dielectric layer;
   depositing a second hard mask layer on the first hard mask layer, wherein said second hard mask layer is an amorphous carbon layer substantially free of silicon;
   depositing a third hard mask layer on the second hard mask layer, wherein said third hard mask layer is a silicon-containing material; and
   completing formation of the dual damascene structure by etching a metal wiring pattern and a via pattern in said dielectric layer and filling said etched metal wiring pattern and via pattern with a conductive material.

2. The method of claim 1 wherein said amorphous carbon layer has a carbon content of between 40–90 atomic percent.

3. The method of claim 2 wherein said amorphous carbon layer has a hydrogen content of between 10–50 atomic percent.

4. The method of claim 3 wherein said amorphous carbon layer has a nitrogen content of between 0–10 atomic percent.

5. The method of claim 1 wherein said dielectric layer comprises a via dielectric layer and a trench dielectric layer formed over said via dielectric layer.

6. The method of claim 5 wherein said dielectric layer further comprises a barrier layer formed under said via dielectric layer.

7. The method of claim 6 wherein said dielectric layer further comprises an etch stop layer formed between said via dielectric layer and said trench dielectric layer.

8. The method of claim 5 wherein the via dielectric is a carbon doped silica film and the trench dielectric is a porous oxide.

9. The method of claim 8 wherein the trench dielectric is a mesoporous silica film.

10. The method of claim 1 wherein said third hard mask layer is selected from the group consisting of silicon dioxide, silicon nitride and silicon oxynitride.

11. The method of claim 1 wherein said first hard mask layer is a carbon doped silica layer.

12. The method of claim 1 wherein said completing step further comprises, after depositing said conductive material, polishing said conductive material using a chemical mechanical polishing step, wherein said first hard mask layer is resistant to said chemical mechanical polishing step.

13. The method of claim 1 wherein said completing step further comprises, after etching said metal wiring pattern and via pattern and before filling said etched metal wiring pattern and via pattern with a conductive material, removing said third hard mask layer.

14. The method of claim 13 wherein said amorphous carbon layer serves as an etch mask during etching of a dielectric barrier layer.

15. The method of claim 1 wherein said amorphous carbon layer is deposited from process gases comprising a hydrocarbon compound having a general formula of $C_xH_y$, and an inert gas.

16. The method of claim 15 wherein said hydrocarbon compound has a general formula of $C_xH_y$, wherein x ranges from 2 to 4 inclusive and y ranges from 2 to 10 inclusive.

17. The method of claim 16 wherein said amorphous carbon layer has a carbon content of between 40–90 atomic percent.

18. The method of claim 17 wherein said amorphous carbon layer has a hydrogen content of between 10–50 atomic percent.

19. The method of claim 18 wherein said amorphous carbon layer has a nitrogen content of between 0–10 atomic percent.

20. The method of claim 15 wherein said process gases further comprise a gas selected from the group consisting of hydrogen, nitrogen, and ammonia.

21. A method of forming a dual damascene structure, said method comprising:
   providing a substrate having a first interconnect layer formed thereon, said first interconnect layer including a dielectric material formed between a plurality of conductive lines;
   forming a barrier dielectric layer over said first interconnect layer;
   forming a via dielectric layer over said barrier dielectric layer;
   forming a porous low dielectric constant layer over said via dielectric layer;
   depositing a first hard mask layer over said porous low dielectric constant layer, wherein said first hard mask is a silicon containing material;
   depositing a second hard mask layer over said first hard mask layer, wherein said second hard mask layer exhibits a high etch selectivity to said via dielectric layer and said porous low k dielectric layer;

depositing a third hard mask layer over said second hard mask layer, wherein said third hard mask layer is a silicon containing material;

forming an organic antireflective coating over said third hard mask;

forming a photoresist layer over said third hard mask layer;

patterning said photoresist layer in accordance with a metal wiring pattern to expose selected portions of said organic antireflective coating;

etching said organic antireflective coating and said third hard mask layer to transfer said metal wiring pattern from said photoresist layer to said organic antireflective coating and said third hard mask layer;

etching said second hard mask layer to transfer said metal wiring pattern to said second hard mask layer and removing said photoresist and said organic antireflective coating;

forming a second organic antireflective coating over said patterned second hard mask layer;

forming a second photoresist layer over said second organic antireflective coating;

patterning said second photoresist layer in accordance with a via pattern to expose selected portions of said second organic antireflective coating;

etching a via hole through said second organic antireflective coating, said third, second and first hard mask layer and at least into said porous low dielectric constant layer;

removing said second photoresist layer and said second organic antireflective coating;

etching said metal wiring pattern into said porous low dielectric constant layer and transfer said via pattern into said via dielectric layer;

etching through said barrier dielectric layer in said via to expose portions of said first interconnect layer; and filling said etched via and metal wiring pattern with a conductive material.

22. The method of claim 21 further comprising filling said etched via and metal wiring pattern with a conductive material.

23. The method of claim 22 wherein said conductive material comprises copper.

24. The method of claim 21 wherein said via dielectric layer comprises porous dielectric material.

25. The method of claim 24 wherein said porous dielectric material comprises a mesoporous silica film.

26. The method of claim 21 wherein said via dielectric layer comprises a carbon doped silica film.

27. The method of claim 21 wherein said via dielectric and said porous low dielectric constant layers both comprise mesoporous silica films, wherein a first dielectric constant of said via dielectric layer is higher than a dielectric constant of said porous low dielectric constant layer.

* * * * *